United States Patent
Son

(10) Patent No.: US 10,103,292 B2
(45) Date of Patent: Oct. 16, 2018

(54) MIXED-LIGHT GENERATION APPARATUS

(71) Applicant: In-sil Song, Seoul (KR)

(72) Inventor: Yeong-hee Son, Seoul (KR)

(73) Assignee: IN-SIL SONG, Seoul (KR)

( * ) Notice: Subject to any disclaimer, the term of this patent is extended or adjusted under 35 U.S.C. 154(b) by 0 days.

(21) Appl. No.: 15/507,248

(22) PCT Filed: Aug. 27, 2015

(86) PCT No.: PCT/KR2015/008982
§ 371 (c)(1),
(2) Date: Feb. 28, 2017

(87) PCT Pub. No.: WO2016/036054
PCT Pub. Date: Mar. 10, 2016

(65) Prior Publication Data
US 2017/0309790 A1    Oct. 26, 2017

(30) Foreign Application Priority Data

Sep. 3, 2014    (KR) .................. 10-2014-0116795

(51) Int. Cl.
*H01L 33/50*        (2010.01)
*H05B 33/08*        (2006.01)
*H01L 25/075*        (2006.01)

(52) U.S. Cl.
CPC .......... *H01L 33/50* (2013.01); *H01L 25/0753* (2013.01); *H01L 33/504* (2013.01); *H05B 33/086* (2013.01); *H05B 33/0857* (2013.01)

(58) Field of Classification Search
CPC ................. H05B 33/0857–33/0872; H01L 33/50–33/508; H01L 25/075–25/0756
See application file for complete search history.

(56) References Cited

U.S. PATENT DOCUMENTS 8,436,556 B2 * 5/2013 Eisele .............. H05B 33/0857
                                                315/152
2001/0005319 A1 * 6/2001 Ohishi .............. H05B 33/0827
                                                362/555
(Continued)

FOREIGN PATENT DOCUMENTS

KR    10-2005-0062433 A    6/2005
KR    10-0818162 B1    3/2008
(Continued)

OTHER PUBLICATIONS

International Search Report for PCT/KR2015/008982 dated Jan. 6, 2016 from Korean Intellectual Property Office.

*Primary Examiner* — Mariceli Santiago
(74) *Attorney, Agent, or Firm* — Revolution IP, PLLC

(57) ABSTRACT

Disclosed is a mixed-light generation apparatus configured to generate mixed-light by mixing light generated from three or more LED-fluorescent combinations each of which comprises an LED-chip and a phosphor layer that is excited by an excitation wavelength of the LED chip to emit light, wherein each of the LED-fluorescent combinations is configured to generate light corresponding to a different coordinate value based on the CIE 1931 color coordinate system, and the mixed-light is configured to be controllable in color within an area based on coordinates of light generated from three or more LED-florescent combinations by respectively controlling driving currents that are supplied to each of the LED-fluorescent combinations.

6 Claims, 4 Drawing Sheets

(56) References Cited

U.S. PATENT DOCUMENTS

| | | | |
|---|---|---|---|
| 2005/0135094 A1* | 6/2005 | Lee | H01L 25/0753 |
| | | | 362/231 |
| 2006/0061252 A1 | 3/2006 | Sohn et al. | |
| 2007/0223219 A1* | 9/2007 | Medendorp, Jr. | C09K 11/586 |
| | | | 362/231 |
| 2007/0291467 A1* | 12/2007 | Nagai | H05B 33/0857 |
| | | | 362/84 |
| 2010/0207134 A1 | 8/2010 | Tanaka et al. | |
| 2010/0219770 A1 | 9/2010 | Kim et al. | |
| 2010/0259924 A1* | 10/2010 | Dong | F21K 9/00 |
| | | | 362/231 |
| 2010/0315012 A1* | 12/2010 | Kim | F21K 9/00 |
| | | | 315/185 R |
| 2013/0114241 A1* | 5/2013 | van de Ven | H05B 33/0863 |
| | | | 362/84 |
| 2014/0246990 A1 | 9/2014 | Kim et al. | |

FOREIGN PATENT DOCUMENTS

| | | |
|---|---|---|
| KR | 10-2010-0044869 A | 4/2010 |
| KR | 10-2013-0014333 A | 2/2013 |
| KR | 10-2013-0027740 A | 3/2013 |
| KR | 10-1417874 B1 | 7/2014 |

* cited by examiner

[FIG. 1]
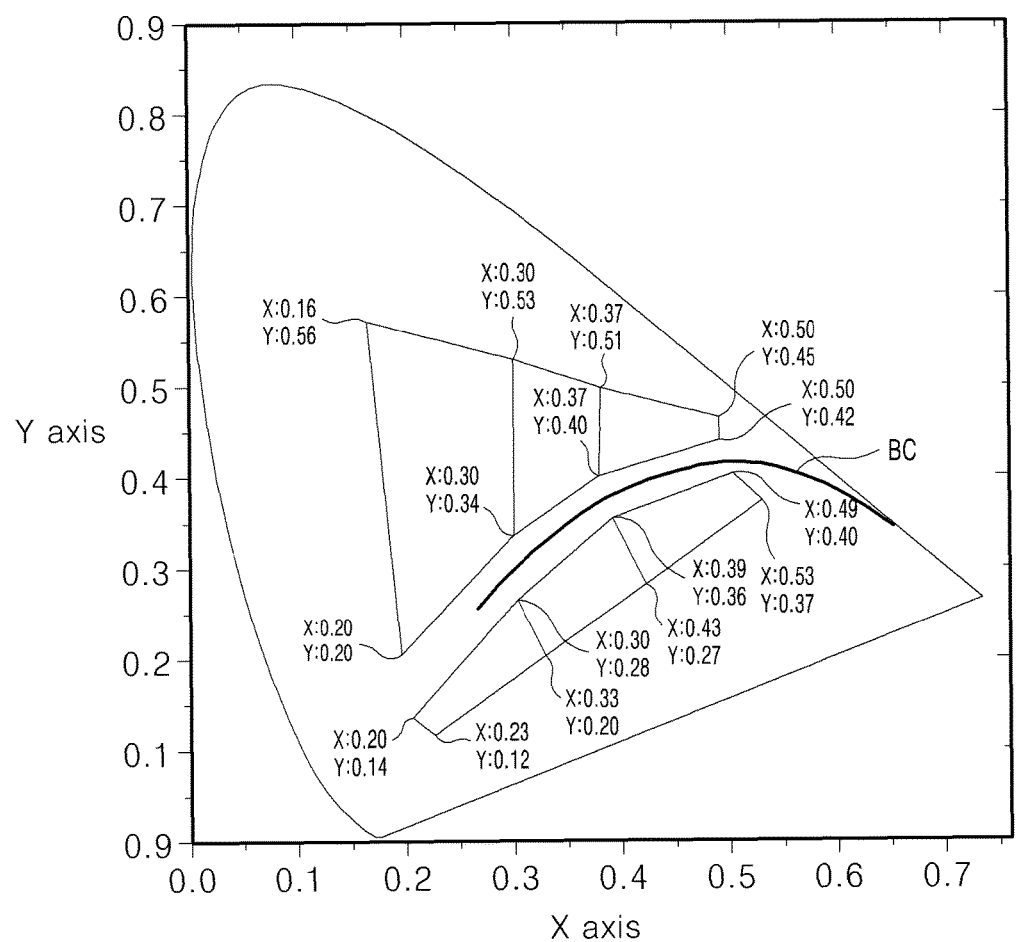

[FIG. 2]
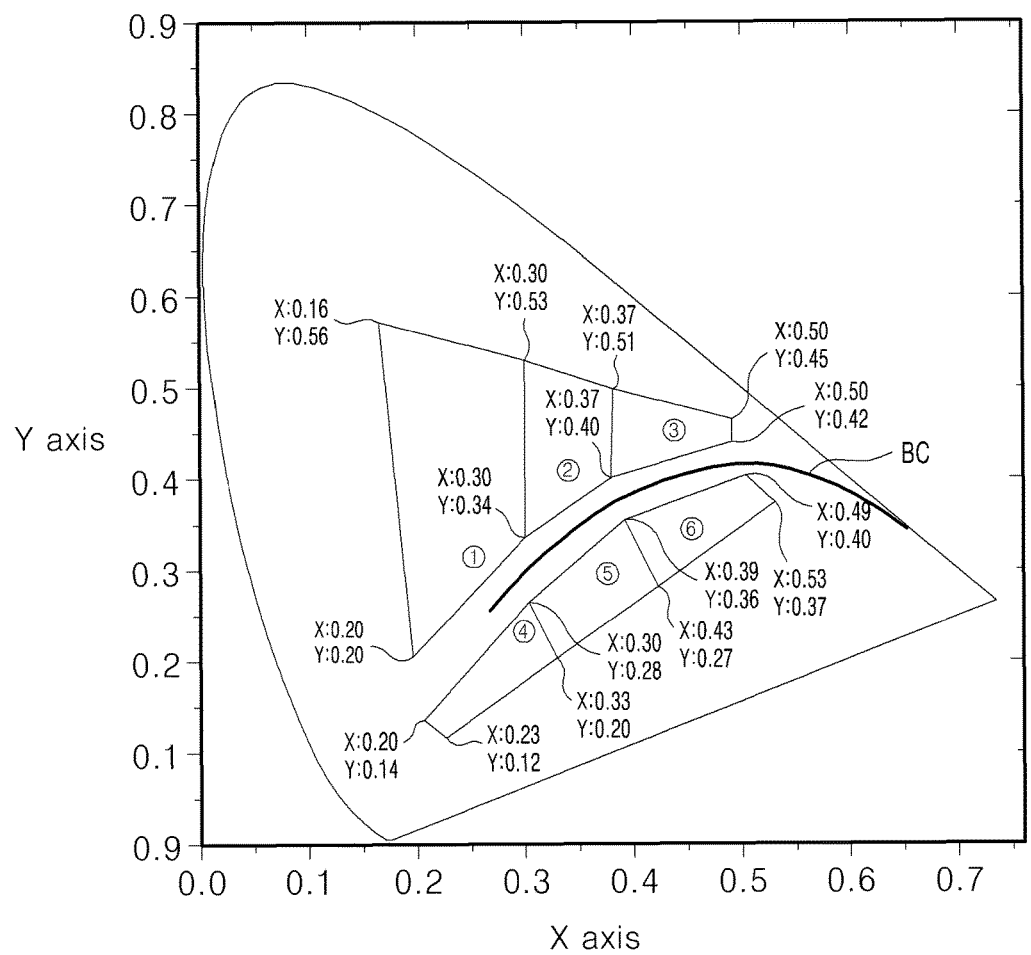

[FIG. 3]
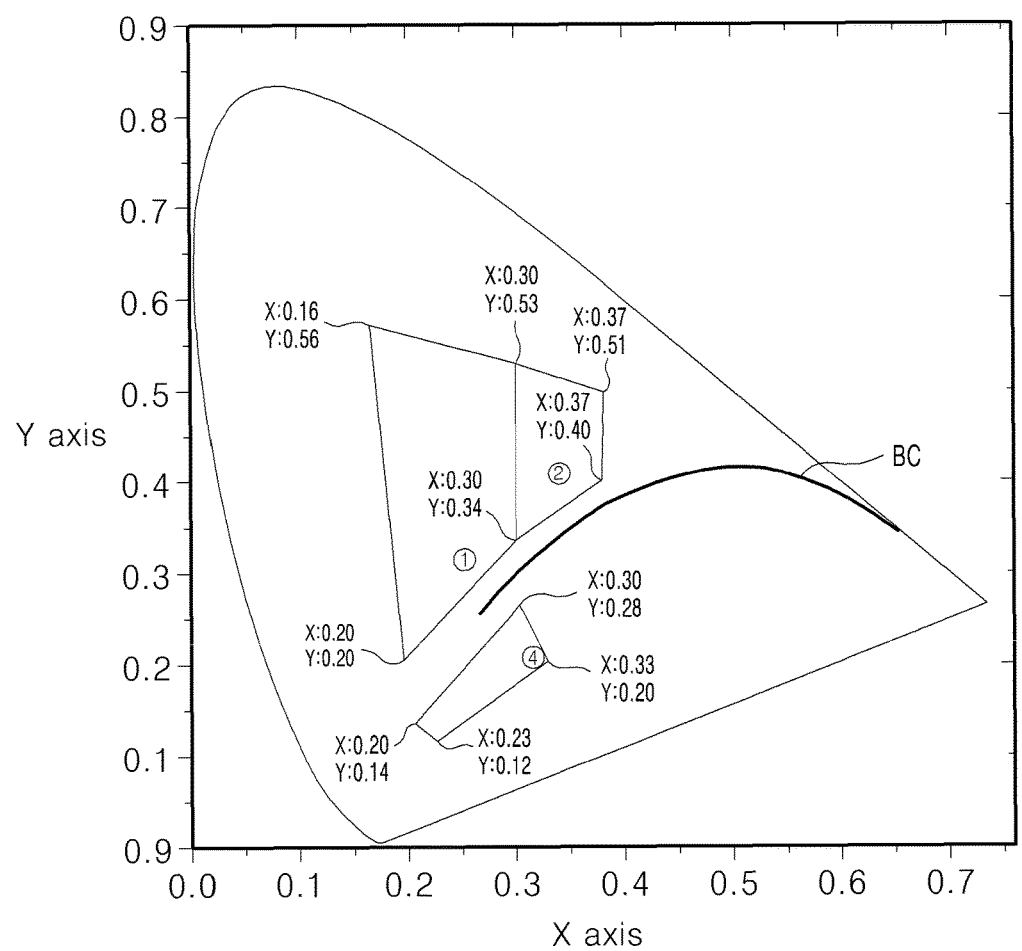

[FIG. 4]
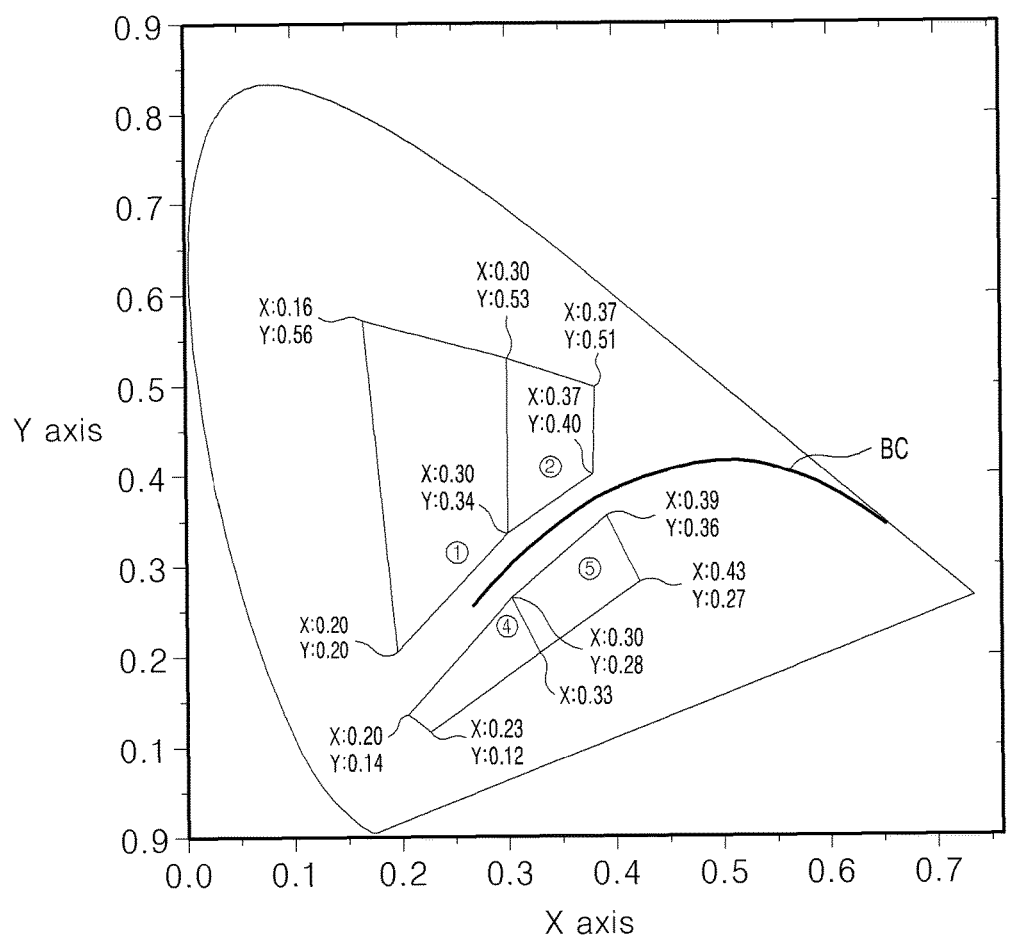

MIXED-LIGHT GENERATION APPARATUS

CROSS REFERENCE TO PRIOR APPLICATIONS

This application is a National Stage Application of PCT International Patent Application No. PCT/KR2015/008982 filed on Aug. 27, 2015, under 35 U.S.C. § 371, which claims priority to Korean Patent Application No. 10-2014-0116795 filed on Sep. 3, 2014, which are all hereby incorporated by reference in their entirety.

TECHNICAL FIELD

The present invention relates to a mixed-light generation apparatus, and more particularly, to a mixed light generation apparatus that generates mixed-light using three or more LED-fluorescent combinations, which is capable of easily realizing multi-colored mixed-light and generating mixed-light having a high color rendering index.

BACKGROUND ART

In general, a light emitting diode (LED) is a device including a compound containing gallium (Ga), phosphorus (P), and arsenic (As) to emit light when a current is applied. Since the LED has a lifespan greater than that of a bulb and a fast response speed, the LED has recently come into the spotlight as a next-generation display device.

Since red, yellow, and green LEDs have been developed, a blue LED is introduced by Dr. Nakamura Shuji. In recent years, researches on a white LED using the blue LED have been actively performed.

Since white light is the most similar to natural light to relieve eye strain, efforts for realizing the white light in the LED as well as other types of display devices have been made.

As a result of such efforts, a cold cathode fluorescent lamp (CCFL) typically used for a computer, a mobile phone, and a projector has been gradually replaced by the white LED device.

In particular, the white LED device has recently been applied to a back light unit (BLU) of a liquid crystal display (LCD) and a lighting, and an application range thereof has gradually been broadened.

The above-described white LED device may be generally divided into a single-chip type and a multi-chip type according to a method of realizing white light.

First, the single-chip type includes a blue LED chip and a YAG-based yellow phosphor. In detail, the single-chip type has a structure in which an encapsulant resin containing the YAG-based phosphor surrounds the blue LED chip.

The above-described single-chip type white LED device provides white light in such a manner that a portion of blue light emitted from the blue LED chip is absorbed to the YAG-based yellow phosphor, the absorbed blue light is converted into yellow light having a long wavelength through the YAG-based yellow phosphor and emitted, and the emitted yellow light and blue light emitted from the blue LED chip, which is not absorbed, are mixed to provide the white light.

However, since the white light realized by the above-described single-chip type white LED device has a wide wavelength spacing between a blue color and a yellow color to generate the color flash effect due to color breakup, mass production of the white LED having the same color coordinates has been difficult.

Also, the color temperature (CT) and the color rendering index (CRI), which are important characteristics for an illumination light source, are extremely difficult to be adjusted. The typical white LED generally has the color rendering index of 75 to 80.

To solve the above-described limitations, the white LED device for increasing the color rendering index using one blue LED chip and a plurality of phosphors is disclosed. However, since the plurality of phosphors need to be mixed, many limitations such as a low yield, heat generation, and a low optical efficiency may occur. Thus, only two kinds of phosphors can be mixed.

Next, the multi-chip type is a method for realizing white light by mounting each of a blue, green, and red LED chips to one package to mix three primary colors of light unlike the above-described single-chip type.

However, in case of the multi-chip type, whereas a high efficiency is achieved, a manufacturing cost is high, and practical efficacy is lower than that of the single-chip type because a high efficiency green LED does not currently exist.

PRIOR DOCUMENTS

Korean Patent Publication No. 10-2013-0014333 (publication date: Feb. 7, 2013)
Korean Patent Registration No. 10-1417874 (registration date: Jul. 3, 2014)

DISCLOSURE OF THE INVENTION

Technical Problem

The purpose of the present invention is to provide a mixed-light generation apparatus that generates mixed-light using three or more LED-fluorescent combinations, which is capable of easily realizing multi-colored mixed light and generating mixed-light having a high color rendering index.

Technical Solution

An embodiment of the present invention provides a mixed-light generation apparatus configured to generate mixed-light by mixing light generated from three or more LED-fluorescent combinations including an LED-chip and a phosphor layer that is excited by an excitation wavelength of the LED chip to emit light. Each of the LED-fluorescent combinations is configured to generate light corresponding to a different coordinate value based on the CIE 1931 color coordinate system, and the mixed-light is configured to be controllable in color within an area based on coordinates of light generated from three or more LED-florescent combinations by respectively controlling driving currents that are supplied to each of the LED-fluorescent combinations.

In an embodiment, as a difference between a sum of a distance to a black body curve from a coordinate of light generated from each of the LED-fluorescent combinations, which generates light corresponding to an upper portion of the black body curve in the CIE 1931 color coordinate system, and a sum of a distance to the black body curve from a coordinate of light generated from each of the LED-fluorescent combinations, which generates light corresponding to a lower portion of the black body curve, is within a predetermined range, the mixed-light may have a white color.

In an embodiment, as a sum of a distance to a black body curve from a coordinate of light generated from each of the_

LED-fluorescent combinations, which generates light corresponding to an upper portion of the black body curve in the CIE 1931 color coordinate system, is equal to a sum of a distance to the black body curve from a coordinate of light generated from each of the LED-fluorescent combinations, which generates light corresponding to a lower portion of the black body curve, the mixed-light may have a white color.

In an embodiment, the LED-fluorescent combination may be configured to emit light within one area selected from six areas defined below, and each of the LED-fluorescent combinations may be configured to emit light within a different area.

First area: (0.16, 0.56), (0.30, 0.53), (0.30, 0.34), (0.20, 0.20)
Second area: (0.30, 0.53), (0.37, 0.51), (0.37, 0.40), (0.30, 0.34)
Third area: (0.37, 0.51), (0.50, 0.45), (0.50, 0.42), (0.37, 0.40)
Fourth area: (0.20, 0.14), (0.30, 0.28), (0.33, 0.20), (0.23, 0.12)
Fifth area: (0.30, 0.28), (0.39, 0.36), (0.43, 0.27), (0.33, 0.20)
Sixth area: (0.39, 0.36), (0.49, 0.40), (0.53, 0.37), (0.43, 0.27)

In an embodiment, the LED chip may be a blue LED chip having a dominant wavelength of 440 nm to 470 nm.

In an embodiment, the phosphor layer may include at least one phosphor having an emission wavelength of 450 nm to 650 nm.

In an embodiment, a color rendering index may be at least 85.

In an embodiment, the mixed-light may be generated by mixing light generated from three or more LED-fluorescent combinations selected from first to sixth LED-fluorescent combinations defined below.

First LED-fluorescent combination: including a blue LED chip having a dominant wavelength of 450 nm and a phosphor, in which a phosphor having an emission wavelength of 520 nm and a phosphor having an emission wavelength of 550 nm are mixed, to generate light with a coordinate of (0.28, 0.34) in the CIE 1931 color coordinate system Second LED-fluorescent combination: including a blue LED chip having a dominant wavelength of 450 nm and a phosphor having an emission wavelength of 560 nm to generate light with a coordinate of (0.33, 0.40) in the CIE 1931 color coordinate system Third LED-fluorescent combination: including a blue LED chip having a dominant wavelength of 450 nm and a phosphor having an emission wavelength of 570 nm to generate light with a coordinate of (0.43, 0.43) in the CIE 1931 color coordinate system Fourth LED-fluorescent combination: including a blue LED chip having a dominant wavelength of 450 nm and a phosphor having an emission wavelength of 580 nm to generate light with a coordinate of (0.28, 0.23) in the CIE 1931 color coordinate system Fifth LED-fluorescent combination: including a blue LED chip having a dominant wavelength of 450 nm and a phosphor having an emission wavelength of 585 nm to generate light with a coordinate of (0.37, 0.29) in the CIE 1931 color coordinate system Sixth LED-fluorescent combination: including a blue LED chip having a dominant wavelength of 450 nm and a phosphor having an emission wavelength of 590 nm to generate light with a coordinate of (0.43, 0.31) in the CIE 1931 color coordinate system Advantageous Effects As described above, the present invention has an advantage in that as the mixed-light is generated by using the three or more LED-fluorescent combinations, multi-colored mixed-light may be easily realized, and also the mixed-light having the high color rendering index may be generated.

BRIEF DESCRIPTION OF THE DRAWINGS

FIG. 1 is a view illustrating an area of light generated from a LED-fluorescent combination constituting a mixed-light generation apparatus according to an embodiment of the present invention.

FIG. 2 is a view illustrating a coordinate of light generated from a LED-fluorescent combination constituting a mixed-light generation apparatus according to a first embodiment of the present invention.

FIG. 3 is a view illustrating a coordinate of light generated from a LED-fluorescent combination constituting a mixed-light generation apparatus according to a second embodiment of the present invention.

FIG. 4 is a view illustrating a coordinate of light generated from a LED-fluorescent combination constituting a mixed-light generation apparatus according to a third embodiment of the present invention.

MODE FOR CARRYING OUT THE INVENTION

The present invention may be embodied in different forms without being out of the scope, technical idea and essential features of the present invention. The preferred embodiments should be considered in descriptive sense only and are not for purposes of limitation.

It will be understood that although the terms of first and second are used herein to describe various elements, these elements should not be limited by these terms.

The terms are only used to distinguish one component from other components. For example, without departing from the scope of the present invention, a first element could be termed a second element, and similarly, a second element could be termed a first element.

The word 'and/or' means that one or more or a combination of relevant constituent elements is possible.

It will also be understood that when an element is referred to as being '"connected to" or "engaged with" another element, it can be directly connected to the other element, or intervening elements may also be present.

It will also be understood that when an element is referred to as being 'directly connected to' another element, there is no intervening elements.

In the following description, the technical terms are used only for explaining a specific exemplary embodiment while not limiting the present invention. The terms of a singular form may include plural forms unless referred to the contrary.

The meaning of 'include' or 'comprise' specifies a property, a number, a step, a process, an element, a component, or a combination thereof in the specification but does not exclude other properties, numbers, steps, processes, elements, components, or combinations thereof.

Unless terms used in the present disclosure are defined differently, the terms may be construed as meaning known to those skilled in the art.

Terms such as terms that are generally used and have been in dictionaries should be construed as having meanings matched with contextual meanings in the art. In this description, unless defined clearly, terms are not ideally, excessively construed as formal meanings.

Hereinafter, embodiments disclosed in this specification is described with reference to the accompanying drawings, and the same or corresponding components are given with the same drawing number regardless of reference number, and their duplicated description will be omitted.

Moreover, detailed descriptions related to well-known functions or configurations will be ruled out in order not to unnecessarily obscure subject matters of the present invention.

A mixed-light generation apparatus according to an embodiment of the present invention is an apparatus that generates mixed-light by mixing light generated from three or more LED-fluorescent combinations including an LED chip and a phosphor layer that is excited by an excitation wavelength of the LED chip to emit light.

In detail, the mixed-light generation apparatus may adopt a well-known constitution in which the phosphor layer seals the LED chip.

The three or more LED-fluorescent combinations of the mixed-light generation apparatus generate light respectively corresponding to different coordinate values based on the CIE 1931 color coordinate system.

In detail, the LED-fluorescent combinations may be distributed on three areas selected from six areas defined below, respectively.

First area: (0.16, 0.56), (0.30, 0.53), (0.30, 0.34), (0.20, 0.20)
Second area: (0.30, 0.53), (0.37, 0.51), (0.37, 0.40), (0.30, 0.34)
Third area: (0.37, 0.51), (0.50, 0.45), (0.50, 0.42), (0.37, 0.40)
Fourth area: (0.20, 0.14), (0.30, 0.28), (0.33, 0.20), (0.23, 0.12)
Fifth area: (0.30, 0.28), (0.39, 0.36), (0.43, 0.27), (0.33, 0.20)
Sixth area: (0.39, 0.36), (0.49, 0.40), (0.53, 0.37), (0.43, 0.27)

For example, the mixed-light may be generated by mixing three light emitted from three LED-fluorescent combinations including the LED-fluorescent combination emitting light within the first area, the LED-fluorescent combination emitting light within the second area, and the LED-fluorescent combination emitting light within the fourth area.

Alternatively, the mixed-light may be generated by mixing four light generated from four LED-fluorescent combinations including the LED-fluorescent combination emitting light within the first area, the LED-fluorescent combination emitting light within the second area, the LED-fluorescent combination emitting light within the fourth area, and the LED-fluorescent combination emitting light within the fifth area.

Further alternatively, the mixed-light may be generated by mixing six light generated from six LED-fluorescent combinations including the LED-fluorescent combination emitting light within the first area, the LED-fluorescent combination emitting light within the second area, the LED-fluorescent combination emitting light within the third area, the LED-fluorescent combination emitting light within the fourth area, the LED-fluorescent combination emitting light within the fifth area, and the LED-fluorescent combination emitting light within the sixth area.

Meanwhile, the mixed-light generated by the mixed-light generation apparatus is configured to be controllable in color by respectively controlling driving currents that are supplied to three or more of the LED-fluorescent combinations, and the mixed-light is configured to be controllable within an area enclosed by three or more of different coordinate values based on the CIE 1931 color coordinate system.

For example, when the mixed-light is generated by mixing three light generated from three LED-fluorescent combinations including a LED-fluorescent combination emitting light within the first area, a LED-fluorescent combination emitting light within the second area, and a LED-fluorescent combination emitting light within the fourth area, the mixed-light is controllable within a triangular area enclosed by coordinates of the three light by respectively controlling driving currents that are supplied to the three LED-fluorescent combinations.

Alternatively, when the mixed-light is generated by mixing four light generated from four LED-fluorescent combinations including a LED-fluorescent combination emitting light within the first area, a LED-fluorescent combination emitting light within the second area, a LED-fluorescent combination emitting light within the fourth area, and a LED-fluorescent combination emitting light within the fifth area, the mixed-light is controllable within a rectangular area enclosed by coordinates of the four light by respectively controlling driving currents that are supplied to the four LED-fluorescent combinations.

Further alternatively, the mixed-light may be generated by mixing six light generated from six LED-fluorescent combinations including the LED-fluorescent combination emitting light within the first area, the LED-fluorescent combination emitting light within the second area, the LED-fluorescent combination emitting light within the third area, the LED-fluorescent combination emitting light within the fourth area, the LED-fluorescent combination emitting light within the fifth area, and the LED-fluorescent combination emitting light within the sixth area, the mixed-light is controllable within a hexagonal area enclosed by coordinates of the six light by respectively controlling driving currents that are supplied to the six LED-fluorescent combinations.

Meanwhile, with regard to a coordinate of light generated from each of the three or more LED-fluorescent combinations of the mixed-light generation apparatus, as a difference between a sum of a distance to a black body curve BC from a coordinate of the light generated from each of the LED-fluorescent combinations generating light corresponding to an upper portion of the black body curve BC in the CIE 1931 and a sum of a distance to the black body curve BC from a coordinate of the light generated from each of the LED-fluorescent combinations generating light corresponding to a lower portion of the black body curve BC is within a predetermined range, the mixed-light may have a white color.

More desirably, as the sum of the distance to the black body curve BC from the coordinate of the light generated from each of the LED-fluorescent combinations generating the light corresponding to the upper portion of the black body curve BC in the CIE 1931 becomes equal to the sum of the distance to the black body curve BC from the coordinate of the light generated from each of the LED-fluorescent combinations generating the light corresponding to the lower portion of the black body curve BC, the mixed-light may have a white color to generate white mixed-light having a high color rendering index.

Meanwhile, the LED chip may include a blue LED chip having a dominant wavelength selected from 440 nm to 470 nm, the phosphor layer may include a phosphor having an emission wavelength selected from 600 nm to 650 nm, and a plurality of phosphors may be mixed to be used as the phosphor layer.

For example, the phosphor constituting the phosphor layer may include well-known phosphor such as LuAG, silicate, YAG, TAG, and nitride.

Meanwhile, the above-described mixed-light generation apparatus may generate the mixed-light by mixing light generated from the three or more LED-fluorescent combinations selected from the first LED-fluorescent combination to the sixth LED-fluorescent combination, which are defined below, and will be described in detail when embodiments are described.

First LED-fluorescent combination: including a blue LED chip having a dominant wavelength of 450 nm and a phosphor, in which a phosphor having an emission wavelength of 520 nm and a phosphor having an emission wavelength of 550 nm are mixed, to generate light with a coordinate of (0.28, 0.34) in the CIE 1931 color coordinate system Second LED-fluorescent combination: including a blue LED chip having a dominant wavelength of 450 nm and a phosphor having an emission wavelength of 560 nm to generate light with a coordinate of (0.33, 0.40) in the CIE 1931 color coordinate system Third LED-fluorescent combination: including a blue LED chip having a dominant wavelength of 450 nm and a phosphor having an emission wavelength of 570 nm to generate light with a coordinate of (0.43, 0.43) in the CIE 1931 color coordinate system Fourth LED-fluorescent combination: including a blue LED chip having a dominant wavelength of 450 nm and a phosphor having an emission wavelength of 580 nm to generate light with a coordinate of (0.28, 0.23) in the CIE 1931 color coordinate system Fifth LED-fluorescent combination: including a blue LED chip having a dominant wavelength of 450 nm and a phosphor having an emission wavelength of 585 nm to generate light with a coordinate of (0.37, 0.29) in the CIE 1931 color coordinate system Sixth LED-fluorescent combination: including a blue LED chip having a dominant wavelength of 450 nm and a phosphor having an emission wavelength of 590 nm to generate light with a coordinate of (0.43, 0.31) in the CIE 1931 color coordinate system First Embodiment ① First LED-fluorescent combination: including a blue LED chip having a dominant wavelength of 450 nm and a phosphor, in which a phosphor having an emission wavelength of 520 nm and a phosphor having an emission wavelength of 550 nm are mixed, to generate light with a coordinate of (0.28, 0.34) in the CIE 1931 color coordinate system ② Second LED-fluorescent combination: including a blue LED chip having a dominant wavelength of 450 nm and a phosphor having an emission wavelength of 560 nm to generate light with a coordinate of (0.33, 0.40) in the CIE 1931 color coordinate system ④ Fourth LED-fluorescent combination: including a blue LED chip having a dominant wavelength of 450 nm and a phosphor having an emission wavelength of 580 nm to generate light with a coordinate of (0.28, 0.23) in the CIE 1931 color coordinate system The mixed-light generation apparatus according to a first embodiment may generate the mixed-light by mixing light generated from the above-described three LED-fluorescent combinations. As a difference between a sum of a distance to the black body curve BC from each of coordinates of light respectively generated from the first LED-fluorescent combination and the second LED-fluorescent combination generating light corresponding to the upper portion of the black body curve BC in the CIE 1931 color coordinate system and a sum of a distance to the black body curve BC from a coordinate of the light generated from the fourth LED-fluorescent combination generating light corresponding to the lower portion of the black body curve BC is within a predetermined range, the mixed-light may have a white color to generate the mixed-light having a high color rendering index.

Meanwhile, as the difference between the two sums becomes smaller, the mixed-light having a high color rendering index may be generated, and when the two sums are equal to each other, the white mixed-light having a higher color rendering index may be generated to generate the mixed-light having the color rendering index of 85 or more.

Meanwhile, in the first embodiment, although the three LED-fluorescent combinations generating light within the first, second, and fourth areas are exemplarily described, the three LED-fluorescent combinations generating light within three different areas randomly selected among the first to sixth areas may be variously combined and constituted.

Second Embodiment

① First LED-fluorescent combination: including a blue LED chip having a dominant wavelength of 450 nm and a phosphor, in which a phosphor having an emission wavelength of 520 nm and a phosphor having an emission wavelength of 550 nm are mixed, to generate light with a coordinate of (0.28, 0.34) in the CIE 1931 color coordinate system ② Second LED-fluorescent combination: including a blue LED chip having a dominant wavelength of 450 nm and a phosphor having an emission wavelength of 560 nm to generate light with a coordinate of (0.33, 0.40) in the CIE 1931 color coordinate system ④ Fourth LED-fluorescent combination: including a blue LED chip having a dominant wavelength of 450 nm and a phosphor having an emission wavelength of 580 nm to generate light with a coordinate of (0.28, 0.23) in the CIE 1931 color coordinate system ⑤ Fifth LED-fluorescent combination: including a blue LED chip having a dominant wavelength of 450 nm and a phosphor having an emission wavelength of 585 nm to generate light with a coordinate of (0.37, 0.29) in the CIE 1931 color coordinate system The mixed-light generation apparatus according to a second embodiment may generate mixed-light by mixing light generated from the above-described four LED-fluorescent combinations. As a difference between a sum of a distance to the black body curve BC from each of the coordinates of the light respectively generated from the first and second LED-fluorescent combinations generating light corresponding to the upper portion of the black body curve BC in the CIE 1931 color coordinate system and a sum of a distance to the black body curve BC from a coordinate of light generated from the fourth LED-fluorescent combination generating light corresponding to the lower portion of the black body curve BC is within a predetermined range, the mixed-light may have a white color to generate the mixed-light having a high color rendering index.

Meanwhile, as the difference between the two sums becomes smaller, the mixed-light having a high color rendering index may be generated, and when the two sums are equal to each other, the white mixed-light having a higher color rendering index may be generated. As the mixed-light is generated by mixing light greater in number than that of the first embodiment, the mixed-light having the color rendering index higher than that of the mixed-light generation apparatus in the first embodiment may be generated.

Meanwhile, in the second embodiment, although the four LED-fluorescent combinations generating light within the first, second, fourth, and fifth areas are exemplarily described, the four LED-fluorescent combinations generating light within four different areas randomly selected among the first to sixth areas may be variously combined and constituted.

Third Embodiment

① First LED-fluorescent combination: including a blue LED chip having a dominant wavelength of 450 nm and a phosphor, in which a phosphor having an emission wavelength of 520 nm and a phosphor having an emission wavelength of 550 nm are mixed, to generate light with a coordinate of (0.28, 0.34) in the CIE 1931 color coordinate system ② Second LED-fluorescent combination: including a blue LED chip having a dominant wavelength of 450 nm and a phosphor having an emission wavelength of 560 nm to generate light with a coordinate of (0.33, 0.40) in the CIE 1931 color coordinate system ③ Third LED-fluorescent combination: including a blue LED chip having a dominant wavelength of 450 nm and a phosphor having an emission wavelength of 570 nm to generate light with a coordinate of (0.43, 0.43) in the CIE 1931 color coordinate system ④ Fourth LED-fluorescent combination: including a blue LED chip having a dominant wavelength of 450 nm and a phosphor having an emission wavelength of 580 nm to generate light with a coordinate of (0.28, 0.23) in the CIE 1931 color coordinate system ⑤ Fifth LED-fluorescent combination: including a blue LED chip having a dominant wavelength of 450 nm and a phosphor having an emission wavelength of 585 nm to generate light with a coordinate of (0.37, 0.29) in the CIE 1931 color coordinate system ⑥ Sixth LED-fluorescent combination: including a blue LED chip having a dominant wavelength of 450 nm and a phosphor having an emission wavelength of 590 nm to generate light with a coordinate of (0.43, 0.31) in the CIE 1931 color coordinate system The mixed-light generation apparatus according to a third embodiment may generate mixed-light by mixing light generated from the above-described six LED-fluorescent combinations. As a difference between a sum of a distance to the black body curve BC from each of coordinates of light respectively generated from the first, second, and third LED-fluorescent combinations generating light corresponding to the upper portion of the black body curve BC in the CIE 1931 color coordinate system and a sum of a distance to the black body curve BC from each of coordinates of the light generated from the fourth, fifth, and sixth LED-fluorescent combinations generating light corresponding to the lower portion of the black body curve BC is within a predetermined range, the mixed-light may have a white color to generate the mixed-light having a high color rendering index.

Meanwhile, as the difference between the two sums becomes smaller, the mixed-light having a high color rendering index may be generated, and when the two sums are equal to each other, the white mixed-light having a higher color rendering index may be generated, and the mixed-light may be generated by mixing light greater in number than those of the first and second embodiments to generate the mixed-light having the color rendering index higher than those of mixed-light generation apparatuses in the first and second embodiments.

While the present invention has been particularly shown and described with reference to the accompanying drawings according to exemplary embodiments, it will be understood by those of ordinary skill in the art that various changes in form and details may be made therein without departing from the spirit and scope of the present invention as defined by the following claims. Therefore, these embodiments are provided so that this disclosure will be thorough and complete, and will fully convey the scope of the present invention to those skilled in the art. Further, the present invention is only defined by scopes of claims.

The invention claimed is:

1. A mixed-light generation apparatus configured to generate mixed-light by mixing light generated from three or more LED-fluorescent combinations each of which comprises an LED-chip and a phosphor layer that is excited by an excitation wavelength of the LED chip to emit light, wherein each of the LED-fluorescent combinations is configured to generate light corresponding to a different coordinate value based on the CIE 1931 color coordinate system, and the mixed-light is configured to be controllable in color within an area based on coordinates of light generated from three or more LED-florescent combinations by respectively controlling driving currents that are supplied to each of the LED-fluorescent combinations, wherein as a sum of a distance to a black body curve from a coordinate of light generated from each of the LED-fluorescent combinations, which generates light corresponding to an upper portion of the black body curve in the CIE 1931 color coordinate system, is equal to a sum of a distance to the black body curve from a coordinate of light generated from each of the LED-fluorescent combinations, which generates light corresponding to a lower portion of the black body curve, the mixed-light has a white color.

2. The mixed-light generation apparatus of claim 1, wherein the LED-fluorescent combination is configured to emit light within one area selected from six areas defined below, and each of the LED-fluorescent combinations is configured to emit light within a different area;

First area: (0.16, 0.56), (0.30, 0.53), (0.30, 0.34), (0.20, 0.20)

Second area: (0.30, 0.53), (0.37, 0.51), (0.37, 0.40), (0.30, 0.34)

Third area: (0.37, 0.51), (0.50, 0.45), (0.50, 0.42), (0.37, 0.40)

Fourth area: (0.20, 0.14), (0.30, 0.28), (0.33, 0.20), (0.23, 0.12)

Fifth area: (0.30, 0.28), (0.39, 0.36), (0.43, 0.27), (0.33, 0.20)

Sixth area: (0.39, 0.36), (0.49, 0.40), (0.53, 0.37), (0.43, 0.27).

3. The mixed-light generation apparatus of claim 1, wherein the LED chip is a blue LED chip having a dominant wavelength of 440 nm to 470 nm.

4. The mixed-light generation apparatus of claim 1, wherein the phosphor layer comprises at least one phosphor having an emission wavelength of 450 nm to 650 nm.

5. The mixed-light generation apparatus of claim 1, wherein a color rendering index is at least 85.

6. A mixed-light generation apparatus configured to generate mixed-light by mixing light generated from three or more LED-fluorescent combinations each of which comprises an LED-chip and a phosphor layer that is excited by an excitation wavelength of the LED chip to emit light, wherein each of the LED-fluorescent combinations is configured to generate light corresponding to a different coordinate value based on the CIE 1931 color coordinate system, and the mixed-light is configured to be controllable in color within an area based on coordinates of light generated from three or more LED-florescent combinations by respectively controlling driving currents that are supplied to each of the LED-fluorescent combinations, wherein the mixed-light is generated by mixing light generated from three or more LED-fluorescent combinations selected from first to sixth LED-fluorescent combinations defined below:

First LED-fluorescent combination: including a blue LED chip having a dominant wavelength of 450 nm and a phosphor, in which a phosphor having an emission wavelength of 520 nm and a phosphor having an emission wavelength of 550 nm are mixed, to generate light with a coordinate of (0.28, 0.34) in the CIE 1931 color coordinate system Second LED-fluorescent combination: including a blue LED chip having a dominant wavelength of 450 nm and a phosphor having an emission wavelength of 560 nm to generate light with a coordinate of (0.33, 0.40) in the CIE 1931 color coordinate system Third LED-fluorescent combination: including a blue LED chip having a dominant wavelength of 450 nm and a phosphor having an emission wavelength of 570 nm to generate light with a coordinate of (0.43, 0.43) in the CIE 1931 color coordinate system Fourth LED-fluorescent combination: including a blue LED chip having a dominant wavelength of 450 nm and a phosphor having an emission wavelength of 580 nm to generate light with a coordinate of (0.28, 0.23) in the CIE 1931 color coordinate system Fifth LED-fluorescent combination: including a blue LED chip having a dominant wavelength of 450 nm and a phosphor having an emission wavelength of 585 nm to generate light with a coordinate of (0.37, 0.29) in the CIE 1931 color coordinate system Sixth LED-fluorescent combination: including a blue LED chip having a dominant wavelength of 450 nm and a phosphor having an emission wavelength of 590 nm to generate light with a coordinate of (0.43, 0.31) in the CIE 1931 color coordinate system.

* * * * *